United States Patent
Endo et al.

[11] Patent Number: 6,037,438
[45] Date of Patent: *Mar. 14, 2000

[54] CYANITE COMPOSITION AND COPPER-CLAD LAMINATE USING THE COMPOSITION

[75] Inventors: Yasuhiro Endo; Yoichi Ueda; Toshiaki Hayashi; Mitsuhiro Shibata, all of Tsukuba; Shuichi Kanagawa, Tsuchiura; Shinichiro Kitayama; Hisashi Watabu, both of Tsukuba, all of Japan

[73] Assignee: Sumitomo Chemical Company, Limited, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/575,011

[22] Filed: Dec. 19, 1995

Related U.S. Application Data

[63] Continuation of application No. 08/199,798, Feb. 22, 1994, abandoned.

[30] Foreign Application Priority Data

Feb. 23, 1993 [JP] Japan ................. 5-033171
Apr. 8, 1993 [JP] Japan ................. 5-081811

[51] Int. Cl.$^7$ .................. C08G 73/00; C08G 73/06
[52] U.S. Cl. ............. 528/211; 528/170; 528/214; 528/216; 528/219; 528/422
[58] Field of Search ................. 528/170, 407, 528/418, 421, 211, 214, 216, 219, 422

[56] References Cited

U.S. PATENT DOCUMENTS

| | | |
|---|---|---|
| 3,553,244 | 1/1971 | Grigat et al. . |
| 4,024,094 | 5/1977 | Kurata et al. ............ 525/416 |
| 4,110,364 | 8/1978 | Gaku et al. . |
| 5,563,237 | 10/1996 | Endo et al. . |

FOREIGN PATENT DOCUMENTS

| | | |
|---|---|---|
| 0206089 | 3/1988 | European Pat. Off. . |
| 0369527 | 5/1990 | European Pat. Off. . |
| 0414461 | 2/1991 | European Pat. Off. . |
| 0516273 | 12/1992 | European Pat. Off. . |
| 0518654 | 12/1992 | European Pat. Off. . |
| 1526035 | 9/1978 | United Kingdom . |
| WO8805443 | 7/1988 | WIPO . |

OTHER PUBLICATIONS

Hoger "Infraotspektoskopische Untersuchung der Cyansäu-reester des 2.6–Di–tert–butyl–phenols und verwandter sterisch behinderter Phenole" Chemische Berichte 94, pp. 1042–1045 1960 (month unavailable).

March, Advanced Organic Chemistry, Wley and Sons 1992 (month unavailable), pp. 273–286.

Derwent Abstract of JP–A–60 240 729 (Mar. 1986).

Patent Abstracts of Japan, vol. 10, No. 112 (C–342), Apr. 25, 1986 (Abstract of JP–A–60 240 729).

*Primary Examiner*—Jeffrey C. Mullis
*Attorney, Agent, or Firm*—Sughrue, Mion, Zinn, Macpeak & Seas, PLLC

[57] ABSTRACT

A cyanate resin composition comprising as essential components a cyanate compound represented by formula (1) or its prepolymer and a curing agent:

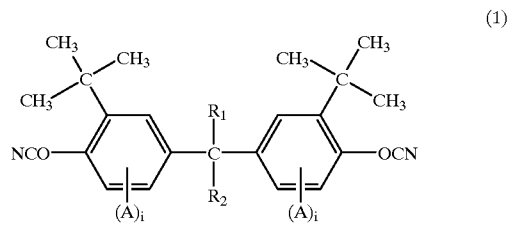

(1)

wherein each of $R_1$ and $R_2$ represents a hydrogen atom or an alkyl group having 1 to 5 carbon atoms; A represents an alkyl group having 1 to 3 carbon atoms; i represents an integer of 0 to 3 alone or together with a brominated epoxy compound or a maleimide compound or its prepolymer, said cyanate resin composition giving a cured product having a low-dielectric constant, and a copper-clad laminate composed of a prepreg of said cyanate resin composition and a copper foil.

1 Claim, No Drawings

CYANITE COMPOSITION AND COPPER-CLAD LAMINATE USING THE COMPOSITION

This is a Continuation of application Ser. No. 08/199,798 filed Feb. 22, 1994 now abandoned.

BACKGROUND OF THE INVENTION

This invention relates to a cyanate resin composition. The cyanate resin of this invention is particularly useful as a resin for laminates in the electric and electronic fields in which low-dielectric property is required, and is also applicable to uses of sealing and molding.

Among the thermosetting resin compositions which have heretofore been used in the electric and electronic fields, the materials for printed wiring base board are mainly combinations of bisphenol type epoxy resins with dicyandiamides and adducts of bismaleimide compounds and amine compounds. Recently, accompanying the multilayering of printed wiring boards, the resins therefor have seen required to have low-dielectric property mainly for the purpose of increasing the signal transfer rate. In the conventional thermosetting resin compositions, it is wellknown to add a low-dielectric thermoplastic resin thereto for meeting such requirements. However, according to this method, such a disadvantage has been pointed out that the heat resistance of the thermosetting resin is impaired, and hence, the resulting resin composition has not sufficiently satisfied the requirement of a low-dielectric resin withstanding practical use.

Under such circumstances, a cyanate resin has been developed and is disclosed in German Patent No. 2533122, WO 88/05443 and the like. Cyanate resins which are now generally used are dicyanates of bisphenol A which have a relatively low-dielectric property. However, the enhancement of computer technique results in a requirement for much lower-dielectric property.

SUMMARY OF THE INVENTION

The present inventors have conducted extensive research on the skeleton of a cyanate compound, and have consequently found that an increase of molecular volume due to the bulkiness of t-butyl group and an increase of nonpolarity due to a large hydrophobic group contribute greatly the low-dielectric property and a composition of a specific cyanate having the t-butyl group and the large hydrophobic group can solve the problems of prior art.

An object of this invention is to provide a cyanate resin composition which is excellent in low-dielectric property and give a cured product having heat resistance withstanding practical use.

Another object of this invention is to provide a copper-clad laminate using the cyanate resin composition.

Other objects and advantages of this invention will become apparent from the following description.

According to this invention, there is provided a cyanate resin composition, which comprises, as essential components, a cyanate compound represented by formula (1) or a prepolymer thereof and a curing agent:

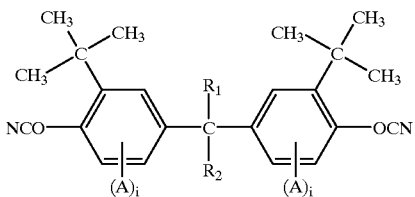

wherein each of $R_1$ and $R_2$ represents a hydrogen atom or an alkyl group having 1 to 5 carbon atoms; A represents an alkyl group having 1 to 3 carbon atoms; and i represents an integer of 0 to 3.

This invention further provides a cyanate resin composition comprising, as essential components, the above-mentioned cyanate compound or prepolymer, a curing agent and at least one member selected from the group consisting of a brominated epoxy compound and a maleimide compound or its prepolymer.

This invention further provides a copper-clad laminate prepared by laminating a copper foil to a prepreg obtained by impregnating a substrate with a solution of one of the resin compositions mentioned above in an organic solvent, and heat-molding the resulting assembly.

DETAILED DESCRIPTION OF THE INVENTION

The cyanate compound which is an essential component of the resin composition of this invention can be prepared by subjecting a cyanogen halide, representatives of which are cyanogen chloride and cyanogen bromide, and a bisphenol represented by formula (2):

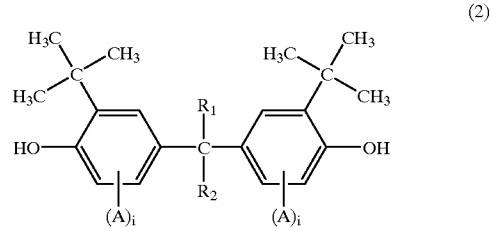

wherein $R_1$, $R_2$, A and i are as defined above as to formula (1) to dehydrohalogenation in the presence of a base in a suitable organic solvent.

The above-mentioned bisphenols may be those obtained by any known method, and the general method of producing the same comprises reacting a carbonyl compound with a phenol in the presence of an acidic catalyst; however, this method is not critical.

The carbonyl compound may be a compound with a carbonyl group having 1 to 11 carbon atoms, and examples thereof include aldehydes such as formaldehyde, acetaldehyde, propionaldehyde, butylaldehyde, valeraldehyde, hexyl aldehyde and the like; and ketone compounds such as acetone, methyl ethyl ketone, methyl propyl ketone, methyl isobutyl ketone, ethyl propyl ketone, diethyl ketone, dipropyl ketone, dibutyl ketone and the like, and formaldehyde, acetaldehyde, propionaldehyde and butylaldehyde are preferred for achieving the purpose of this invention.

The phenols may be those which have a t-butyl group in the ortho-position to the OH group but no substituent in the para-position and which may have an alkyl group having three or less carbon atoms, and examples thereof include 2-t-butylphenol, 2-t-butyl-5-methylphenol, 2-t-butyl-3-methylphenol, 2-t-butyl-6-methylphenol, 2-t-butyl-5-ethylphenol, 2-t-butyl-3-ethylphenol, 2-t-butyl-3-propylphenol and the like. 2-t-Butylphenol and 2-t-butyl-5-methylphenol are preferred for achieving the purpose of this invention.

A representative example of the cyanate compound used in this invention is a compound represented by the structural formula (3):

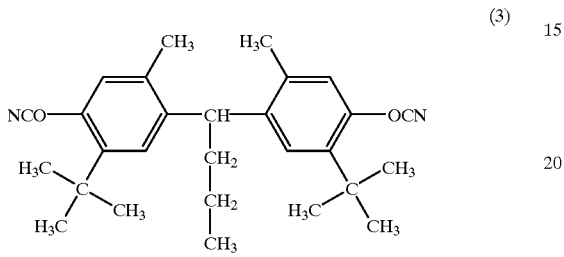
(3)

The curing agent for the resin composition of this invention may be any known curing agent, and examples thereof include protonic acids representatives of which are hydrochloric acid, phosphoric acid and the like; Lewis acids, representatives of which are aluminum chloride, boron trifluoride, zinc chloride and the like; aromatic hydroxyl compounds, representatives of which are phenol, pyrocatechol, dihydroxynaphthalene and the like; organometal salts, representatives of which are zinc naphthenate, cobalt naphthenate, tin octylate, cobalt octylate and the like; tertiary amines, representatives of which are triethylamine, tributylamine, quinoline, isoquinoline and the like; quaternary ammonium salts, representatives of which are tetraethylammonium chloride, tetrabutylammonium bromide and the like; imidazoles; sodium hydroxide; sodium methylate; triethylamine; tributylamine; diazabicyclo-(2,2,2)-octane; triphenylphosphine; and mixtures thereof. Organometal salts such as zinc naphthenate, cobalt octylate, tin octylate and the like are preferable in view of compatibility and reactivity with the resin.

The maleimide compound used in this invention is a compound containing at least two N-maleimido groups, which compound may be prepared by any method. Among these maleimide compounds, those represented by formula (4) are preferable for obtaining a low-dielectric cyanate resin composition:

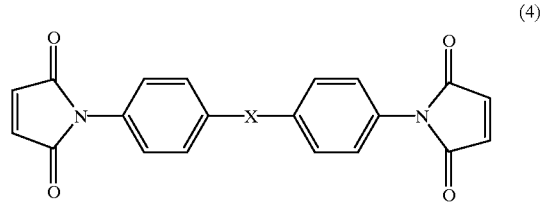
(4)

wherein X represents a group represented by formula (5), (6), (7), (8), (9) or (10):

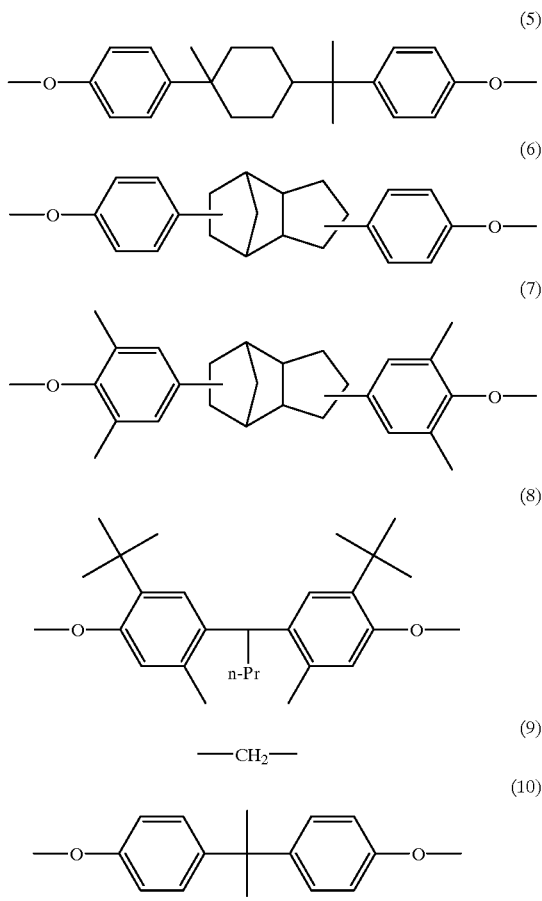

The cyanate compound and maleimide compound used in this invention can be used in the form of a prepolymer. The prepolymer can be formed by heating the cyanate compound or the maleimide compound alone or a mixture of the respective compounds in the presence of the above-mentioned curing agent.

When a flame retardance is imparted to the copper-clad laminate of this invention, for example, a brominated epoxy compound is incorporated into the composition so that the bromine content becomes 5 to 25% by weight. Taking into consideration availability and economical effect, preferable examples of the brominated epoxy compound are glycidyl ether of tetrabromobisphenol A and glycidyl ether of brominated phenol novolak; however, the brominated epoxy compound is not limited to them.

The resin composition of this invention may be used with other thermosetting resins as far as they do not adversely affect the purpose. Examples of said other thermosetting resins include epoxy resins, representatives of which are digylcidyl ethers of bisphenol A and bisphenol F, glycidyl ethers of phenol novolak and cresol novolak and the like; addition polymers of bismaleimides and diamine compounds; alkenyl-aryl ether resins, representatives of which are vinylbenzyl ethers of bisphenol A and tetrabromobisphenol A and vinylbenzyl ethers of diaminodiphenylmethane; alkynyl ether resins, representatives of which are dipropargyl ethers of bisphenol A and tetrabromobisphenol A and propargyl ethers of diaminodiphenylmethane and the like; and also include phenol resins, resol resins, allyl ether compounds, allylamine compounds, triallyl cyanurate, vinyl group-containing polyolefin compounds and the like.

However, said other resin are not limited to these examples. Thermoplastic resins may also be added and examples of the resins include polyphenylene ether, polystyrene, polyethylene, polybutadiene, polyimide and their modification products though the resins are not limited to these examples.

These thermosetting or thermoplastic resins may be mixed with the cyanate resin composition or may be previously reacted with the cyanate resin.

In this invention, a known additive such as a flame retarder, a releasing agent, a surface-treating agent, a filler or the like may be added to the cyanate resin composition depending upon the purpose of use of the composition.

The flame retarder includes antimony trioxide, red phosphorus and the like; the releasing agent includes waxes, zinc stearate and the like; and the surface-treating agent includes silane coupling agents. The filler includes silica, alumina, talc, clay, glass fiber and the like.

The copper-clad laminate using the cyanate resin composition of this invention is used in a printed wiring base board requiring low-dielectric property.

The copper-clad laminate of this invention can be prepared by a known method. That is, a substrate is impregnated with a resin varnish prepared by dissolving the cyanate resin composition of this invention in an organic solvent, heat-treating the impregnated substrate to form a prepreg, then laminate a copper foil to the prepreg and thereafter heat-molding the resulting assembly to prepare a copper-clad laminate.

The organic solvent used includes acetone, methyl ethyl ketone, methyl isobutyl ketone, ethylene glycol monomethyl ether, propylene glycol monomethyl ether, toluene, xylene, N,N-dimethylformamide, dioxane, tetrahydrofuran and the like, and these may be used alone or in admixture of two or more.

The substrate which is impregnated with the resin varnish includes inorganic fibers and organic fibers such as glass fiber, polyester fiber, polyamide fiber and the like; also woven fabrics, nonwoven fabrics and mats composed of the organic fibers; paper and the like. These may be used alone or in combination of two or more.

The conditions for heat-treating the prepreg are appropriately varied depending upon the kinds and amounts of the solvent used, the catalyst added and the various additives used; however, the heat-treatment is preferably conducted at a temperature of 100° C. to 200° C. for a period of 3 minutes to 30 minutes.

The heat-molding is preferably conducted by hotpressing at a temperature of 150° C. to 300° C. at a molding pressure of 10 kg/cm$^2$ to 100 kg/cm$^2$ for a period of 20 minutes to 300 minutes.

The cyanate resin composition of this invention is excellent in low-dielectric property and gives a cured product having heat resistance withstanding practical use.

Further, the copper-clad laminate of this invention has the various properties of conventional copper-clad laminates and also has excellent low-dielectric property, excellent water resistance and heat resistance withstanding practical use.

DESCRIPTION OF PREFERRED EMBODIMENTS

Examples of this invention are shown below; however, this invention should not be limited to the Examples.

SYNTHESIS EXAMPLE 1

The present Synthesis Example relates to a process for preparing dicyanate of 1,1-bis(5-t-butyl-2-methyl-4-hydroxyphenyl)butane which is one of the cyanate compounds essential to the resin composition of this invention.

In 800 g of acetone was dissolved 200 g (1.05 moles) of 1,1-bis(5-t-butyl-2-methyl-4-hydroxyphenyl)-butane (Sumilizer BBM-S, a trade name of Sumitomo Chemical Co., Ltd.), and the solution was cooled to −5° C. Thereto was added 77.3 g (1.26 moles) of cyanogen chloride, after which 111.3 g (1.10 moles) of triethylamine was dropwise added in one hour with such attention that the reaction temperature did not become 0° C. or higher. After completion of the dropwise addition, the reaction mixture was kept at 2–5° C. for one hour and then diluted with 500 g of chloroform. After the resulting triethylamine hydrochloride was removed by filtration, the filtrate was washed with water, and the solvent was removed by distillation under reduced pressure to obtain 194.8 g of a yellow resinous product.

The cyanate compound thus obtained was subjected to infrared absorption spectroscopy to confirm that absorption due to phenolic OH at 3200–3600 cm$^{-1}$ disappeared and absorption due to nitrile of cyanate appeared at 2270 cm$^{-1}$.

SYNTHESIS EXAMPLE 2

The present Synthesis Example relates to a process for preparing N,N'-bis(4-aminophenoxyphenyl)-menthane bismaleimide which is a maleimide compound used in this invention.

In a 5-liter, four-necked flask were placed 237.3 g of maleic anhydride and 2,373 g of chlorobenzene, and they were stirred in a nitrogen atmosphere to prepare a solution. Into the flask was dropped at 25±5° C. in two hours through a dropping funnel 1,625.1 g of a dimethylacetamide solution of (4-aminophenoxyphenyl)-menthane (concentration was adjusted to 34.3% by weight) obtained by reacting YP-90 (a trade name of Yasuhara Chemical for a reaction product of dipentene with phenol, hydroxyl equivalent: 162 g/eq.) with p-chlorobenzene and then reducing the reaction product. The reaction was continued at 35° C. for two hours to complete the amic acidation.

Subsequently, 10.46 g of p-toluenesulfonic acid monohydrate was added to the reaction mixture and the mixture was subjected to dehydration-ring-closure reaction under reduced pressure at 100° C. for one hour and then at 110° C. for one hour while effecting azeotropic dehydration, and subsequently at 135° C. for four hours while the pressure was gradually returned to atmospheric pressure. The reaction was allowed to proceed while the water formed was separated from the system by use of a Dean-Stark apparatus.

Subsequently, under reduced pressure, chlorobenzene and then dimethylacetamide were recovered 89% in total. Subsequently, 2,200 g of methyl isobutyl ketone was added to the residue, and the resulting solution was cooled to 60° C., after which sodium bicarbonate in such an amount that the pH of the aqueous layer might become 5–7 and 1,000 g of water were added thereto to neutralize the same. Thereafter, the neutralization product was washed and then the aqueous layer was removed therefrom. The remaining layer was further washed two times with 1,000 g of a 15% aqueous sodium chloride solution at 60° C. and then the aqueous layer was removed therefrom, after which the remaining layer was subjected to azeotropic dehydration under reduced pressure. The salt formed was then removed therefrom by filtration and the filtrate was concentrated under reduced pressure. After the conditions reached finally 150° C./5 Torr, the product was taken out of the flask in the molten state to obtain 724 g (yield: 98.7%) of pale brown solid. The solid was subjected to gel permeation chromatography (GPC) to find that 95% of N,N'-bis(4-aminophenoxyphenyl)menthane bismaleimide and 5% of high molecular weight component were contained.

Physical properties thereof are shown below.

Mass spectrum M+=666

Melting point: 96–98° C.

$^1$H-NMR spectrum δ: 0.6–2.1 ppm (m, aliphatic), 2.8 ppm (m, methine), 6.8 ppm (s, imide group), 6.9–7.4 ppm (m, aromatic)

Infrared absorption spectrum: 1238 cm$^{-1}$ (ether bond), 1712 cm$^{-1}$ (imide bond)

SYNTHESIS EXAMPLE 3

The present Synthesis Example relates to a process for preparing N,N'-bis(4-aminophenoxy)dicyclopentane bismaleimide which is one of the maleimide compounds used in this invention.

The same procedure as in Synthesis Example 2 was repeated, except that the bis(4-aminophenoxyphenyl) menthane derived from YP-90 was replaced by 932.9 g of a dimethylacetamide solution (concentration was adjusted to 34.3% by weight) of bis(4-aminophenoxyphenyl) dicyclopentane similarly derived from DPP-600T (a trade name of Nippon Oil Co., Ltd.) to obtain 617.4 g (yield: 98%) of yellow crystals of N,N'-bis(4-aminophenoxyphenyl) dicyclopentane bismaleimide.

Physical properties thereof are shown below.

Mass spectrum M+=662, 1060

$^1$H-NMR spectrum δ: 1.0–2.5 ppm (m, aliphatic), 2.7 ppm (m, methine), 6.8 ppm (s, imide group), 6.6–7.3 ppm (m, aromatic)

Infrared absorption spectrum: 1222 cm$^{-1}$ (ether bond), 1712 cm$^{-1}$ (imide bond)

SYNTHESIS EXAMPLE 4

The present Synthesis Example relates to a process for preparing N,N'-bis-[4-(4-aminophenoxy)-3,5-dimethylphenyl]dicyclopentane bismaleimide which is one of the maleimide compounds used in this invention.

In a 1-liter, four necked flask were placed 58.8 g of maleic anhydride and 137.2 g of acetone, and they were stirred in a nitrogen atmosphere to prepare a solution. Into the flask was dropped in two hours a solution in 350 g of acetone of 150.0 g of a dicyclopentane oligomer having 4-(4-aminophenoxy)-3,5-dimethylphenyl groups at both terminals [a product obtained by reacting DXP-L-9-1 manufactured by Nippon Oil Co., Ltd. (a reaction product of 2,6-xylenol with dicyclopentadiene, hydroxyl group equivalent: 191 g/eq.) with p-chloronitrobenzene and then reducing the nitro group of the product, said product containing 90% of bis[4-(4-aminophenoxy)-3,5-dimethylphenyl] dicyclopentane as confirmed by GPC measurement and having an amine equivalent of 275 g/eq.)] while the temperature was kept at room temperature to 35° C., and stirring was continued for a further three hours. Subsequently, 16.6 g of triethylamine was added and the resulting mixture was stirred at room temperature for a half hour, after which 0.58 g of nickel acetate was added and the temperature was elevated to 40° C. Thereinto was dropped 72.4 g of acetic anhydride in one hour, after which the same temperature was kept until the reaction was completed. After completion of the reaction, the reaction mixture was poured into 1,000 g of pure water. Crystals were collected by filtration, washed with water and then with methanol and thereafter warmed under reduced pressure to dry the same, thereby obtaining yellow crystals of the objective product in an amount of 189.4 g (yield: 97.9%).

Physical properties thereof are shown below.

Mass spectrum M+=718

$^1$H-NMR spectrum δ: 1.0–2.5 ppm (m, aliphatic), 2.7 ppm (m, methine), 6.8 ppm (s, imide group), 6.5–7.3 ppm (m, aromatic)

Infrared absorption spectrum:

1220 cm$^{-1}$ (ether bond), 1714 cm$^{-1}$ (imide bond)

SYNTHESIS EXAMPLE 5

The present Synthesis Example relates to a process for preparing N,N'-1,1-bis[4-(4-aminophenoxy)-5-t-butyl-2-methylphenyl]butane bismaleimide which is one of the maleimide compound used in this invention.

In a 2-liter, four-necked flask were placed 97.1 g of maleic anhydride and 226.5 g of acetone, and they were stirred under a nitrogen stream to prepare a solution. While the temperature was kept at room temperature to 35° C., a solution of 256.6 g of 1,1-bis[4-(4-aminophenoxy)-5-t-butyl-2-methylphenyl]butane in 598.5 g of acetone was dropped into the flask in two hours, after which stirring was continued for a further three hours. Thereto was added 27.3 g of triethylamine and the resulting mixture was stirred at room temperature for a half hour, after which 0.95 g of nickel acetate was added and the temperature was elevated to 40° C. Into-the flask was dropped 119.9 g of acetic anhydride in one hour, and then the same temperature was kept until the reaction was completed. After completion of the reaction, the reaction mixture was poured into 2.5 kg of water and crystals were collected by filtration. The crystals were washed with water, and then with methanol, and warmed under reduced pressure to dry the same. Yellow crystals of the objective product were obtained in an amount of 306.1 g (yield: 93.9%). This can be recrystallized from a methyl Cellosolve/isopropyl alcohol mixed solvent.

Physical properties thereof are shown below.

Melting point: 127–130° C.

Mass spectrum M+=724

$^1$H-NMR δ: 0.97 ppm (t, —CHCH$_2$CH$_2$CH$_3$), 1.34 ppm (s, t-butyl group), 1.92 ppm (q, —CHCH$_2$CH$_2$CH$_3$), 2.17 ppm (s, methyl group), 4.13 ppm (t, =CHCH$_2$CH$_2$CH$_3$), 6.65 ppm (s, imide group), 6.8–7.2 ppm (m, aromatic)

Infrared absorption spectrum:

1219 cm$^{-1}$ (ether bond), 1712 cm$^{-1}$ (imide bond)

EXAMPLE 1

The present Example relates to the preparation of a cured product of a resin composition using the cyanate compound obtained in Synthesis Example 1.

The cyanate compound obtained in Synthesis Example 1 was melt-mixed with 0.1% by weight of zinc naphthenate, and methyl ethyl ketone was added thereto to prepare a 50% by weight solution. At 180° C., the compound was converted into a prepolymer, and thereafter, the prepolymer was pressed at 200° C. at 50 kg/cm$^2$ for 30 minutes, and then post-cured at 200° C. for two hours, to obtain a cured product having a thickness of about 2 mm.

EXAMPLE 2

The present Example relates to the preparation of a cured product of the cyanate compound obtained in Synthesis Example 1 with diglycidyl ether of tetrabromobisphenol A.

Zinc naphthenate (0.3 part by weight) was mixed with 80 parts by weight of the cyanate compound obtained in Synthesis Example 1 and 20 parts by weight of diglycidyl ether of tetrabromobisphenol A (Sumiepoxy ESB-400T, a trade name of Sumitomo Chemical Co., Ltd.), and methyl ethyl ketone was added thereto to prepare a 50% by weight solution. At 180° C., the mixture was converted to a prepolymer and the prepolymer was pressed at 200° C. at 50 kg/cm$^2$ for 30 minutes, and then post-cured at 230° C. for five hours to obtain a cured product having a thickness of about 2 mm.

EXAMPLES 3 TO 8

The cyanate compound obtained in Synthesis Example 1 was melt-mixed with zinc naphthenate which is a curing agent at 140° C. to prepare a prepolymer. This cyanate prepolymer was blended with one of the maleimide compounds obtained in Synthesis Examples 2 to 5 or N,N'-bis(4-aminophenyl)methane bismaleimide [manufactured by KI Kasei K. K.] or N,N'-2,2-bis(4-aminophenoxyphenyl)propane bismaleimide (MB 8000, manufactured by Mitubishi Petrochemical Co., Ltd.) in a proportion as shown in Table 1 together with a curing agent as shown in Table 1 to prepare a cured product of resin alone. Physical properties thereof are shown in Table 1.

COMPARATIVE EXAMPLE 1

The present Comparative Example relates to the preparation of a cured product of a resin composition using dicyanate of bisphenol A.

Using dicyanate of bisphenol A, a cured product having a thickness of 2 mm was prepared in the same manner as in Example 1. Physical properties thereof are shown in Table 1.

COMPARATIVE EXAMPLE 2

The present Comparative Example relates to the preparation of a resin composition using dicyanate of bis(3,5-dimethyl-4-hydroxyphenyl)methane (tetramethyl bisphenol F).

Using the dicyanate mentioned above, a cured product having a thickness of 2 mm was prepared in the same manner as in Example 1. Physical properties thereof are shown in Table 1.

COMPARATIVE EXAMPLE 3

In the same manner as in Examples 3 to 8, a cured product of a resin alone was prepared from a dicyanate compound of bisphenol A using the compounding recipe shown in Table 1. Physical properties of the cured product are shown in Table 1.

In Table 1, the glass-transition temperature and dielectric constant of the cured product were measured by the following methods:

Glass-transition temperature: Measured by means of a thermal mechanical analyzer TMA-40 manufacture by Shimadzu Corp.

Dielectric constant: Electrodes were prepared on both surfaces of a cured product having a thickness of about 2 mm by coating the surfaces with a metallic paint, electrostatic capacity was measured by means of 4275A Multi-Frequency LCR meter manufactured by Yokogawa-Hewlett-Packard, Ltd., and dielectric constant was calculated from the capacity.

TABLE 1

Compounding recipe and physical properties of cured product of resin alone

| | Ex. 1 | Ex. 2 | Ex. 3 | Ex. 4 | Ex. 5 |
|---|---|---|---|---|---|
| Cyanate compound of Synthesis Example 1 | 100 | 80 | 90 | 90 | 90 |
| Bisphenol A dicyanate | — | — | — | — | — |
| Tetramethylbisphenol F dicyanate | — | — | — | — | — |
| Bismaleimide compd. 1 | — | — | 10 | — | — |
| Bismaleimide compd. 2 | — | — | — | 10 | — |
| Bismaleimide compd. 3 | — | — | — | — | 10 |
| Bismaleimide compd. 4 | — | — | — | — | — |
| Bismaleimide compd. 5 | — | — | — | — | — |
| Bismaleimide compd. 6 | — | — | — | — | — |
| Sumiepoxy ESB-400T | — | 20 | — | — | — |
| Zinc naphthenate | 0.1 | 0.3 | 0.8 | 0.8 | 0.8 |
| 2-Ethyl-4-methylimidazole | — | — | 0.05 | 0.05 | 0.05 |
| Glass-transition temp. (° C.) | 218 | 200 | 224 | 214 | 212 |
| Dielectric constant (1 MHz) | 2.63 | 2.88 | 2.70 | 2.67 | 2.67 |
| Loss tangent (1 MHz) | — | — | 0.004 | 0.003 | 0.003 |

TABLE 1-continued

Compounding recipe and physical properties of cured product of resin alone

| | Ex. 6 | Ex. 7 | Ex. 8 | Comp. Ex. 1 | Comp. Ex. 2 | Comp. Ex. 3 |
|---|---|---|---|---|---|---|
| Cyanate compound of Synthesis Example 1 | 90 | 90 | 90 | — | — | — |
| Bisphenol A dicyanate | — | — | — | 100 | — | 90 |
| Tetramethylbisphenol F dicyanate | — | — | — | — | 100 | — |
| Bismaleimide compd. 1 | — | — | — | — | — | — |
| Bismaleimide compd. 2 | — | — | — | — | — | — |
| Bismaleimide compd. 3 | — | — | — | — | — | — |
| Bismaleimide compd. 4 | 10 | — | — | — | — | — |
| Bismaleimide compd. 5 | — | 10 | — | — | — | 10 |
| Bismaleimide compd. 6 | — | — | 10 | — | — | — |
| Sumiepoxy ESB-400T | — | — | — | — | — | — |
| Zinc naphthenate | 0.8 | 0.8 | 0.8 | 0.1 | 0.1 | 0.1 |
| 2-Ethyl-4-methylimidazole | 0.05 | 0.05 | 0.05 | — | — | — |
| Glass-transition temp. (° C.) | 221 | 218 | 215 | 249 | 208 | 230 |
| Dielectric constant (1 MHz) | 2.70 | 2.73 | 2.73 | 3.30 | 3.00 | 3.15 |
| Loss tangent (1 MHz) | 0.004 | 0.004 | 0.004 | — | — | 0.006 |

Note:
Cyanate compd. of Synthesis Example 1: 1,1-Bis(5-t-butyl-3-methyl-4-cyanatophenyl)butane
Bisphenol A dicyanate: 2,2-Bis(4-cyanatophenyl)propane
Tetramethylbisphenol F dicyanate: Bis(4-cyanato-3,5-dimethylphenyl)methane
Bismaleimide compd. 1: N,N'-bis(4-aminophenoxyphenyl)methane bismaleimide
Bismaleimide compd. 2: N,N'-bis(4-aminophenoxyphenyl)dicyclopentane bismaleimide
Bismaleimide compd. 3: N,N'-bis[4-(4-amino-phenoxy)-3,5-dimethylphenyl] dicyclopentane bismaleimide
Bismaleimide compd. 4: N,N'-1,1-bis[4-(4-aminophenoxy)-5-t-butyl-2-methylphenyl]butane bismaleimide
Bismaleimide compd. 5: N,N'-bis(4-aminophenyl)-methane bismaleimide
Bismaleimide compd. 6: N,N'-2,2-bis(4-aminophenoxyphenyl)-propane bismaleimide

EXAMPLES 9 AND 10

The cyanate compound obtained in Synthesis Example 1 was mixed with a curing agent in the proportions shown in Table 2. Incidentally, in Example 10, in addition to the curing agent, glycidyl ether of tetrabromobisphenol A (Sumiepoxy ESB-400T, a trade name of Sumitomo Chemical Co., Ltd., epoxy equivalent: 403 g/eq.) was incorporated into the resin composition in such an amount that the Br content might become 10% by weight in order to impart a flame retardance to the resin. The compositions obtained were first melt-mixed at 140° C. to form a prepolymer, and zinc naphthenate was added as a catalyst to the prepolymer thus obtained, after which the mixture was dissolved in methyl ethyl ketone to prepare a uniform resin varnish. A glass cloth (KS-1600S962LP, a trade name of KANEBO LTD.) was impregnated with the resin varnish, and the thus impregnated glass cloth was treated in a hot air drier at 160° C. for 3 to 10 minutes to obtain a prepreg. Five sheets of the prepreg were put one on another and a copper foil (TTAI treated, 35-$\mu$ thickness, manufactured by Furukawa Circuit Foil Co., Ltd.) was laminated to both surfaces of the resulting assembly, after which the assembly was hot-pressmolded at 200° C. at a pressure of 50 kg/cm$^2$ for 120 minutes, and then after-cured at 200° C. for 120 minutes to prepare a copper-clad laminate having a thickness of 1 mm.

Glass-transition temperature (Tg) was determined from the inflection point of the thermal expansion curve obtained using a thermal analyzer DT-30 manufactured by Shimadzu Corp. Dielectric constant and loss tangent at room temperature were measured by means of a 4275A Multi-Frequency LCR meter manufactured by Yokogawa-Hewlett-Packard, Ltd., and the dielectric constant was calculated from the electrostatic capacity of a sample. Solder heat resistance and boiling water absorption were measured according to JIS-C-6481. The measurement results are shown in Table 2.

EXAMPLES 11 TO 17

Copper-clad laminates were prepared by using the cyanate compound obtained in Synthesis Example 1 and various maleimide compounds and curing agents in the proportions shown in Table 2.

In Example 17, in addition to the above combination of components, glycidyl ether of tetrabromo-bisphenol A (Sumiepoxy ESB-400T, a trade name of Sumitomo Chemical Co., Ltd., epoxy equivalent: 403 g/eq.) was added to the resin composition so that the Br content might become 10% by weight in order to impart a flame retardance to the resin composition and then a copper-clad laminate was prepared by using the resulting compound. In the preparation of the copper-clad laminates using the compsitions, first of all, the cyanate compound obtained in Synthesis Example 1 was melt-mixed with zinc naphthenate at 140° C. as in Examples 3 to 8 to prepare a prepolymer, and then, to the prepolymer were added one of the maleimide compound obtained in Synthesis Examples 2 to 5, N,N'-bis(4-aminophenyl) methane bismaleimide (K I Kasei K.K.) or N,N'-2,2-bis(4-aminophenoxyphenyl)propane bismaleimide (MB 8000, a trade name of Mitubishi Yuka Co., Ltd.) and zinc naphthenate as a catalyst, after which the resulting mixture was dissolved in N,N-dimethylformamide to prepare a uniform resin varnish. A glass cloth (KS-1600S962LP, a trade name of KANEBO LTD.) was impregnated with the varnish and then treated by a hot air drier at 160° C. for 3 to 10 minutes to obtain a prepreg. Five sheets of the prepreg were put one on another and then a copper foil manufactured by Furukawa Circuit Foil K. K. (TTAI-treated, 35-$\mu$ thickness) was laminated to both surfaces of the resulting assembly, after which the assembly was hot-press-molded at 200° C. at a pressure of 50 kg/cm$^2$ for 120 minutes and then after-cured at 200° C. for 120 minutes to obtain a copper-clad laminate having a thickness of 1 mm. Physical properties of the laminates obtained are shown in Table 2.

COMPARATIVE EXAMPLES 4 AND 5

Dicyanate of bisphenol A was compounded with a curing agent alone or together with a brominated epoxy resin ESB-400T in the proportions shown in Table 2. Using the resulting compound, a copper-clad laminate was prepared in the same manner as in Examples 9 and 10. Physical properties of the laminates obtained are shown in Table 2.

COMPARATIVE EXAMPLE 6

Dicyanate compound of bisphenol A was compounded with the components shown in Table 2 in the proportions shown in Table 2, and using the resulting compound, a copper-clad laminate was prepared in the same manner as in Examples 11 to 17. Physical properties of the laminate obtained are shown in Table 2.

TABLE 2

Compounding recipe and physical properties of laminates

| | Ex. 9 | Ex. 10 | Ex. 11 | Ex. 12 | Ex. 1 |
|---|---|---|---|---|---|
| Cyanate compound of Synthesis Example 1 | 100 | 80 | 90 | 90 | 90 |
| Bisphenol A dicyanate | — | — | — | — | — |
| Bismaleimide compd. 1 | — | — | 10 | — | — |
| Bismaleimide compd. 2 | — | — | — | 10 | — |
| Bismaleimide compd. 3 | — | — | — | — | 10 |
| Bismaleimide compd. 4 | — | — | — | — | — |
| Bismaleimide compd. 5 | — | — | — | — | — |
| Bismaleimide compd. 6 | — | — | — | — | — |
| Sumiepoxy ESB-400T | — | 20 | — | — | — |
| Zinc naphthenate | 0.1 | 0.8 | 0.8 | 0.8 | 0.8 |
| 2-Ethyl-4-methyl imidazole | — | 0.05 | 0.05 | 0.05 | 0.95 |
| Glass-transition temp. (° C.) | 245 | 234 | 223 | 214 | 218 |
| Dielectric constant (1 MHz) | 3.43 | 3.60 | 3.55 | 3.50 | 3.51 |
| Loss tangent (1 MHz) | 0.004 | 0.004 | 0.004 | 0.003 | 0.003 |
| Boiling water absorption (%, 48 hrs) | 0.33 | 0.35 | 0.29 | 0.30 | 0.31 |
| Solder heat resistance (260° C. × 3 min) | ◯ | ◯ | ◯ | ◯ | ◯ |

| | Ex. 14 | Ex. 15 | Ex. 16 | Ex. 17 | Comp. Ex. 4 | Comp. Ex. 5 | Comp. Ex. 6 |
|---|---|---|---|---|---|---|---|
| Cyanate compound of Synthesis Example 1 | 90 | 90 | 90 | 80 | — | — | — |
| Bisphenol A dicyanate | — | — | — | — | 100 | 90 | 90 |
| Bismaleimide compd. 1 | — | — | — | — | — | — | — |
| Bismaleimide compd. 2 | — | — | — | — | — | — | — |
| Bismaleimide compd. 3 | — | — | — | — | — | — | — |
| Bismaleimide compd. 4 | 10 | — | — | — | — | — | — |
| Bismaleimide compd. 5 | — | 10 | — | 10 | — | — | — |
| Bismaleimide compd. 6 | — | — | 10 | — | — | — | 10 |
| Sumiepoxy ESB-400T | — | — | — | 10 | — | 20 | — |
| Zinc naphthenate | 0.8 | 0.8 | 0.8 | 0.8 | 0.1 | 0.1 | 0.3 |
| 2-Ethyl-4-methyl imidazole | 0.05 | 0.05 | 0.05 | 0.05 | — | — | 0.05 |
| Glass-transition temp. (° C.) | 218 | 220 | 218 | 218 | 256 | 247 | 227 |
| Dielectric constant (1 MHz) | 3.54 | 3.70 | 3.72 | 3.80 | 4.06 | 4.15 | 4.20 |
| Loss tangent (1 MHz) | 0.004 | 0.004 | 0.004 | 0.005 | 0.007 | 0.007 | 0.004 |
| Boiling water | 0.28 | 0.35 | 0.35 | 0.40 | 1.45 | 1.58 | 0.70 |

TABLE 2-continued

Compounding recipe and physical properties of laminates absorption
(%, 48 hrs)
Solder heat     ◯  ◯  ◯  ◯  ◯  ◯  ◯
resistance
(260° C. ×
3 min)

Note:
Cyanate compd. of Synthesis Example 1: 1,1-Bis(5-t-butyl-3-methyl-4-cyanatophenyl)butane
Bisphenol A dicyanate: 2,2-Bis(4-cyanatophenyl)propane
Bismaleimide compd. 1: N,N'-bis(4-aminophenoxyphenyl)menthane bismaleimide
Bismaleimide compd. 2: N,N'-bis(4-aminophenoxyphenyl)dicyclopentane bismaleimide
Bismaleimide compd. 3: N,N'-bis[4-(4-aminophenoxyphenyl)-3,5-dimethylphenyl]dicyclopentane bismaleimide
Bismaleimide compd. 4: N,N'-1,1-bis[4-(4-aminophenoxy)-5-t-butyl-2-methylphenyl]butane bismaleimide
Bismaleimide compd. 5: N,N'-bis(4-aminophenyl)methane bismaleimide
Bismaleimide compd. 6: N,N'-2,2-bis(4-aminophenoxyphenyl)propane bismaleimide

What is claimed is:

1. A cyanate resin composition, comprising as essential components a cyanate compound of formula (3):

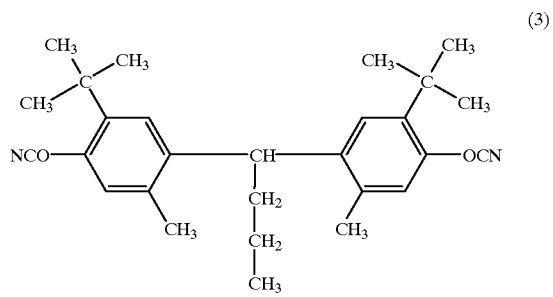

or its prepolymer, and a curing agent.

* * * * *